(12) United States Patent
Perreault et al.

(10) Patent No.: US 12,341,473 B1
(45) Date of Patent: *Jun. 24, 2025

(54) MULTILEVEL AMPLIFIER SYSTEMS AND RELATED TECHNIQUES

(71) Applicant: Murata Manufacturing Co., Ltd., Kyoto (JP)

(72) Inventors: David J. Perreault, Cambridge, MA (US); John R. Hoversten, Arlington, MA (US); Yevgeniy A. Tkachenko, Belmont, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/409,310

(22) Filed: Jan. 10, 2024

Related U.S. Application Data

(63) Continuation of application No. 17/155,887, filed on Jan. 22, 2021, now Pat. No. 11,909,358.

(Continued)

(51) Int. Cl.
*H03F 1/02* (2006.01)
*H03F 3/21* (2006.01)

(52) U.S. Cl.
CPC ............ *H03F 1/0211* (2013.01); *H03F 3/211* (2013.01); *H03F 2200/102* (2013.01); *H03F 2200/165* (2013.01); *H03F 2200/451* (2013.01)

(58) Field of Classification Search
CPC .. H03F 1/0211; H03F 3/211; H03F 2200/102; H03F 2200/165; H03F 2200/451

(Continued)

(56) References Cited

U.S. PATENT DOCUMENTS 7,103,114 B1 9/2006 Lapierre
7,746,041 B2 6/2010 Xu et al.
(Continued)

OTHER PUBLICATIONS

Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.

(Continued)

*Primary Examiner* — Hafizur Rahman
(74) *Attorney, Agent, or Firm* — DALY, CROWLEY, MOFFORD & DURKEE, LLP

(57) ABSTRACT

Described is a system for modulating power to one or more radio frequency (RF) amplifiers to suppress undesired output signal components, improve linearity and reduce noise. The described systems and techniques enable shaping of spectral components introduced via an amplifier bias voltage owing to transitions among bias discrete states. The systems and techniques facilitate operation of multilevel, RF amplifiers under a wider range of operating conditions. In embodiments, the system includes modulators coupled to a supply terminal port of each of the one or more amplifiers to modulate the voltage levels supplied to the one or more amplifiers. The outputs of the modulators may be combined to provide a combined signal coupled to the amplifiers. A delay circuit delays switching of at least one of the power modulators relative to other modulator, by a variable time delay. This results in suppression of undesired output signal components of the amplifier output.

32 Claims, 11 Drawing Sheets

Related U.S. Application Data

(60) Provisional application No. 62/964,365, filed on Jan. 22, 2020.

(58) Field of Classification Search
USPC .......................................................... 333/297
See application file for complete search history.

(56) References Cited

U.S. PATENT DOCUMENTS

| | | |
|---|---|---|
| 7,777,459 B2 | 8/2010 | Williams |
| 7,782,027 B2 | 8/2010 | Williams |
| 7,786,712 B2 | 8/2010 | Williams |
| 7,812,579 B2 | 10/2010 | Williams |
| 7,977,927 B2 | 7/2011 | Williams |
| 8,026,763 B2 | 9/2011 | Dawson et al. |
| 8,164,384 B2 | 4/2012 | Dawson et al. |
| 8,212,541 B2 | 7/2012 | Perreault et al. |
| 8,824,978 B2 | 9/2014 | Briffa et al. |
| 8,829,993 B2 | 9/2014 | Briffa et al. |
| 8,830,709 B2 | 9/2014 | Perreault et al. |
| 8,830,710 B2 | 9/2014 | Perreault et al. |
| 8,860,396 B2 | 10/2014 | Giuliano |
| 8,957,727 B2 | 2/2015 | Dawson et al. |
| 9,020,453 B2 | 4/2015 | Briffa et al. |
| 9,160,287 B2 | 10/2015 | Briffa et al. |
| 9,166,536 B2 | 10/2015 | Briffa et al. |
| 9,172,336 B2 | 10/2015 | Briffa et al. |
| 9,209,758 B2 | 12/2015 | Briffa et al. |
| 9,490,752 B2 | 11/2016 | Briffa et al. |
| 9,531,291 B2 | 12/2016 | Perreault |
| 9,537,456 B2 | 1/2017 | Briffa et al. |
| 9,634,577 B2 | 4/2017 | Perreault |
| 9,755,672 B2 | 9/2017 | Perreault et al. |
| 9,768,731 B2 | 9/2017 | Perreault et al. |
| 9,768,732 B2 | 9/2017 | Briffa et al. |
| 9,917,517 B1 | 3/2018 | Jiang et al. |
| 9,940,752 B2 | 4/2018 | Tommy et al. |
| 9,979,421 B2 | 5/2018 | Astrom et al. |
| 10,038,461 B2 | 7/2018 | Briffa et al. |
| 10,164,577 B2 | 12/2018 | Briffa et al. |
| 10,193,441 B2 | 1/2019 | Giuliano |
| 10,389,235 B2 | 8/2019 | Giuliano |
| 10,658,981 B2 | 5/2020 | Briffa et al. |
| 10,992,265 B2 | 4/2021 | Hoversten et al. |
| 11,191,028 B2 | 11/2021 | Hoversten et al. |
| 11,245,367 B2 | 2/2022 | Garrett et al. |
| 11,637,531 B1 | 4/2023 | Perreault et al. |
| 11,664,727 B2 | 5/2023 | Giuliano et al. |
| 11,736,010 B2 | 8/2023 | Giuliano et al. |
| 11,757,410 B2 | 9/2023 | Hoversten et al. |
| 2008/0019459 A1 | 1/2008 | Chen et al. |
| 2010/0073084 A1 | 3/2010 | Hur et al. |
| 2021/0288614 A1 | 9/2021 | Hoversten et al. |
| 2021/0385752 A1 | 12/2021 | Hoversten et al. |
| 2022/0103066 A1 | 3/2022 | Chen et al. |
| 2022/0131463 A1 | 4/2022 | Giuliano et al. |
| 2022/0149725 A1 | 5/2022 | Garrett et al. |
| 2023/0054485 A1 | 2/2023 | Hoversten et al. |
| 2023/0056740 A1 | 2/2023 | Perreault et al. |
| 2023/0057037 A1 | 2/2023 | Hoversten et al. |

OTHER PUBLICATIONS

Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.

Chen, et al; "A High Efficiency High Power Step-Up Resonant Switched-Capacitor"; 2012 IEEE Energy Conversion Congress and Exposition (ECCE); Sep. 15-20, 2012; 5 Pages.

Shoyama, et al.; "Resonant Switched Capacitor Converter with High Efficiency"; 2004 35th Annual IEEE Power Electronics Specialists Conference; 2004; 7 Pages.

Sun, et al.; "High Power Density, High Efficiency System Two-Stage Power Architecture for Laptop Computers"; 2006 37th IEEE Power Electronics Specialists Conference; Jun. 18-22, 2006; 7 Pages.

Unknown; "Fundamentals of Power Electronics"; Chapter 19: Resonant Conversion; Sep. 19, 2019; 87 Pages.

Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.

U.S. Appl. No. 17/155,887, filed Jan. 22, 2021, Perreault et al.

Raab, Average Efficiency of Class-G Power Amplifiers, IEEE Transactions on Consumer Electronics, vol. CE-32, No. 6, pp. 145-150, May 1986.

Walling et al., A Class-G Supply Modulator and Class-E PA in130nm Cmos, IEEE Journal of Solid-State Circuits, vol. 44, No. 9, pp. 2339-2347, Sep. 2009.

Godoy et al., A 2.4-GHz, 27-dBm Asymmetric Multilevel Outphasing Power Amplifier in 65-nm CMOS, IEEE Journal of Solid State Circuits, vol. 47, No. 10, pp. 2372-2384, Oct. 2012.

Rhombus Industries Inc., Data Sheet, "Delay Lines", 1998; 3 pages.

"Inductor Current Time Delay", Mar. 11, 2006, W8JI://www.w8ji.com; 5 pages.

Application Note AC130, "Designing State Machines for FPGAs", Actel Corporation, Sep. 1997, 8 pages.

U.S. Non-Final Office Action dated Jun. 8, 2023 for U.S. Appl. No. 17/155,887; 14 pages.

Response to U.S. Non-Final Office Action dated Jun. 8, 2023 for U.S. Appl. No. 17/155,887; Response filed on Sep. 7, 2023; 11 pages.

U.S. Notice of Allowance dated Oct. 10, 2023 for U.S. Appl. No. 17/155,887; 6 pages.

MULTILEVEL AMPLIFIER SYSTEMS AND RELATED TECHNIQUES

CROSS REFERENCE TO RELATED APPLICATIONS

This application is a continuation of U.S. patent application Ser. No. 17/155,887 (filed Jan. 22, 2021), which claims the benefit of U.S. Provisional Application No. 62/964,365 (filed Jan. 22, 2020), which are incorporated here by reference.

BACKGROUND

Achieving both high efficiency and high linearity of radio-frequency (RF) amplifier systems, and in particular RF power amplifier systems, is a longstanding challenge. One means of improving efficiency in such systems is an architecture where the amplifier system is switched with discrete transitions among a set of operating states, such as an RF amplifier system in which the drain bias voltage for one or more power amplifiers comprising the RF amplifier system is dynamically selected from more than one possible source or level. This includes systems where the drain voltage of at least one RF amplifier (e.g. at least one RF power amplifier) is selected (e.g., via switches) from among multiple discrete supply voltages.

Discrete output states can also be realized through systems in which the drain voltage is derived from a DC-DC converter that has a plurality of preferred discrete output voltage levels. The efficiency of RF power amplifiers can be improved through a technique referred to as "supply modulation" (sometimes also referred to as "drain modulation" or "collector modulation"). In such a technique, a power supply voltage provided to the power amplifier is adjusted dynamically ("modulated") over time depending upon the RF signal being synthesized. For the largest efficiency improvements, supply voltage can be adjusted discretely (among discrete levels) or continuously on a short time scale that tracks or dynamically accommodates rapid variations in RF signal amplitude (or envelope), such as may occur as data is encoded in the RF signal or as the RF signal amplitude is desired to be changed with high envelope bandwidth (e.g., as in envelope tracking, envelope tracking advanced, polar modulation, "class G" power amplification, multilevel back-off, multilevel LINC, Asymmetric Multilevel Outphasing, etc.). The power supply voltage (or voltage levels) provided to the power amplifier may also be adapted to accommodate longer-term changes in desired RF envelope (e.g., "adaptive bias") such as associated with adapting transmitter output strength to minimize errors in data transfer, for RF "traffic" variations, etc.

SUMMARY

In accordance with the concepts, systems, circuits and techniques described here, disclosed is a system for modulating power supply signals to one or multilevel, radio frequency (RF) amplifiers to suppress undesired output signal components, improve linearity and reduce noise (including but not limited to receive-band noise).

The described concepts, systems and techniques enable shaping of spectral components introduced via an amplifier bias voltage owing to transitions among discrete bias states (e.g. discrete bias voltages). The described systems and techniques facilitate operation of multilevel, RF amplifiers under a wider range of operating conditions than is otherwise realized. The described concepts, systems and techniques provide means to accomplish this at small size and cost, which is important in the mobile communications industry.

In embodiments, the system includes modulators coupled to a bias port of each of the one or more amplifiers to modulate the voltage levels supplied to the one or more amplifiers. The outputs of the modulators may be combined to form a combined signal that goes to the amplifiers. The amplifier outputs may also be combined into a combined signal for transmission. A delay circuit delays switching of at least one of the power supply signals provided by a first modulator, relative to power supply signals provided by another modulator, by a variable time delay. This results in attenuation of the amplifier RF output signals and/or the combined signal at chosen frequencies.

The nature of the drain voltage transitions in such systems can be important to at least the linearity and noise characteristics (generally the quality) of the RF signal output by the RF amplifier (or RF amplifier system) that is achieved. The nature of the drain voltage transitions can also affect the achievable output power and the combination of bandwidth and efficiency that can be achieved power amplifiers (PAs), in particular, respond to both changes in the RF input signal and ta dc bias signal (e.g. a supply voltage) provided to the RF amplifier (e.g. an RF input signal provided to a gate terminal of a field effect transistor (FET) and a supply voltage signal provided to a drain terminal of the FET). Frequency components in the drain voltage (e.g. resultant from switching between voltage bias levels) get "mixed" with the RF input, yielding components in the RF output frequency spectrum in regions around and proximate to the carrier frequency. The resulting response can be controlled to a significant extent through adjustments in the RF input(s) to the power amplifier(s) to achieve the desired RF output while reducing undesired components. At the same time, it is often desirable to shape the voltage transitions at the drain inputs to the power amplifiers (i.e. shape the voltage signal at points where the voltage signal changes value to reduce or ideally eliminate undesired spectral components caused by sharp transitions between voltage levels). Such shaping may be achieved, for example, with a "transition filter." Use of a transition filter results in low-frequency drain voltage variations that are desired to support a targeted RF output at all times, while eliminating high frequency signal components in the drain voltage that yield undesired spectral components in the RF output. It is especially desirable to reduce high-frequency drain voltage components that are hard to compensate via the RF inputs to the PA. Such undesired components in the RF output may lead to leakage into adjacent channels (reducing "linearity" through worsening of "Adjacent Channel Leakage Ratio", or ACLR). Moreover, such undesired components in the RF output can appear in the receive band of a transceiver system, contributing to receive-band "noise."

A system that mitigates these unwanted spectral components may provide a benefit, especially a system that operates well across a wide range of bandwidths and/or in different bands (e.g., with different receive-band spacings and placements) and/or for both time-division duplexing ("TDD") and frequency-division duplexing ("FDD").

The concepts, systems, circuit and techniques described herein are directed toward means for suppressing undesired output components in such multilevel RF amplifier systems (e.g., including for purposes of improving linearity and reducing undesired RF output components (or "noise"), such as receive-band noise, in such systems). In particular, the system described here may improve the shaping of the spectral components introduced at the drain voltage owing to transitions among discrete states. Moreover, the system may facilitate operation of such systems under a wider range of Operating conditions than is easily realized otherwise. In addition, the systems and methods may provide means to accomplish this at small size and cost, which is important in the mobile communications industry.

In an embodiment, a system for modulating power to an amplifier includes: an amplifier configured to receive a first signal for amplification; a multi-level power supply; a first modulator coupled to the multi-level power supply and configured to provide a first modulated power output; and a second modulator coupled to the multi-level power supply and providing a second modulated power output. A combiner circuit is coupled to the first and second modulators to receive the first modulated power output and the second modulated power output, the combiner circuit configured to combine the first modulated power output and the second modulated power output into a combined power output. The combined power output is coupled to the bias port of an amplifier. A delay circuit is coupled the first modulator to delay modulation of the first modulated power output relative to the second modulated output by a time delay.

In an embodiment, a system for modulating power supply signals to at least one amplifier, includes a first amplifier coupled to receive a first signal for amplification; a second RF amplifier coupled to receive a second RF signal for amplification; a multi-level power supply, the multi-level power supply configured to generate supply voltages; a first modulator coupled to the multi-level power supply and the first RF amplifier to modulate the supply voltages provided to the first RF amplifier; a second modulator coupled to the multilevel power supply and the second RF amplifier to modulate the supply voltages provided to the second amplifier; and a control circuit coupled to provide first control signals to the first modulator to cause the first modulator to transition from a first supply voltage level to a second, different supply voltage level provided to a supply terminal of the first RF amplifier and coupled to the second modulator to cause the second modulator to transition from a first supply voltage level to a second, different supply voltage level provided to the second amplifier; and a delay circuit coupled to at least one of the first and second modulators to delay the control signals provided to one of the first and second modulators by a period of time selected to suppress undesired signal components of an RF output signal, improve linearity of an RF output signal and reduce noise (including but not limited to receive-band noise) of an RF output signal. Thus introduction of such a time delay improves the quality of an RF signal.

In another embodiment, a system for modulating supply voltages provided to supply terminals of power amplifiers includes: a plurality of RF amplifiers configured to receive RF signals at RF input ports thereof; at least one multi-level power supply coupled to respective supply terminals of the plurality of RF amplifiers; a plurality of modulators coupled between the at least one multi-level power supplies and the supply terminals of respective ones of the plurality of RF amplifiers to modulate the supply voltages provided to the plurality of RF amplifiers; a control circuit coupled to provide control signals to the plurality of modulators to modulate the supply voltages provided to the plurality of RF amplifiers; and one or more delay circuits coupled between the control circuit and respective ones of the plurality of modulators to delay control signals received by the respective ones of the plurality of modulators.

In another embodiment, a system for modulating supply signals to two or more RF amplifiers includes: a first RF amplifier configured to receive a first RF signal at an RF input thereof; a second RF amplifier configured to receive a second RF signal at an RF input thereof; a multi-level power supply; a first modulator coupled to the multilevel power supply and the first RF amplifier to modulate the supply signals provide to the first RF amplifier; a second modulator coupled to the multilevel power supply and the second RF amplifier to modulate supply signals provided to the second RF amplifier; and means for delaying modulation of one or more supply signals provided to the first RF amplifier, one or more supply signals provided to the second RF amplifier, or both.

BRIEF DESCRIPTION OF THE DRAWINGS

Examples of the concepts, systems, circuits, and techniques disclosed herein are illustrated in the drawings. Because it is impractical or impossible to describe every embodiment of the technology, the drawings are provided as examples only and are not intended to limit the scope of the concepts sought to be protected.

Like numbers of the drawings denote like elements throughout the views.

DETAILED DESCRIPTION

Figure 1:
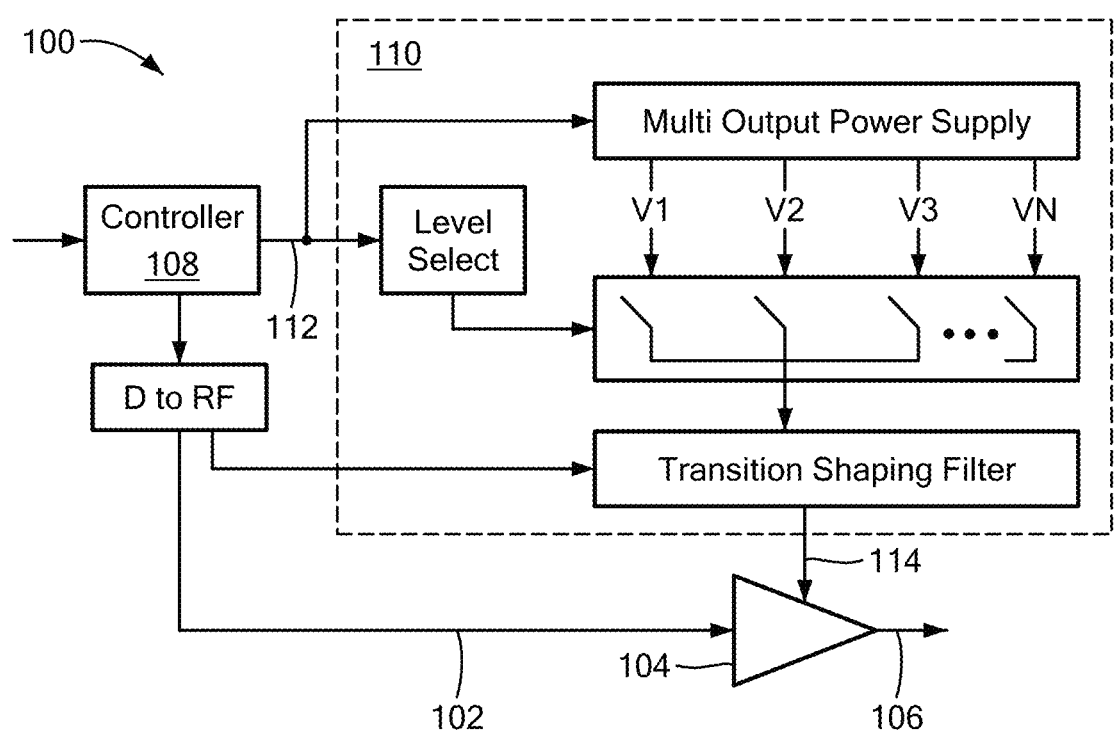
FIG. 1 is a block diagram of an amplifying system in which a power supply bias provided to a radio frequency (RF) amplifier (e.g. an RF power amplifier (PA)) is dynamically selected from multiple inputs depending upon one or more characteristics of an RF input signal provided to an RF input of the RF amplifier.

Referring now to FIG. 1, a radio frequency (RF) transmit system 100 (which may be part of a transceiver, for example) has one or more RF amplifiers 104 (with only one amplifier being shown in FIG. 1). Each of the RF amplifiers 104 has an RF input 102 at which RF signals may be provided and an RF output 106 at which an amplified version of the RF input signal is provided. The system 100 thus produces amplified RF output signals at the RF amplifier output 106.

The system 100 further includes a control circuit 108 coupled to a power management circuit (PMC) 110. The system 100 generates control signals 112 (or more generally, signals which provide control information) which may be provided over a wired or wireless signal path to an input of the power management circuit (PMC). Control information includes but is not limited to configuration such as configuration of multi-pulse transitions, configuration of techniques trading RxBN for efficiency performance, configuration of general-purpose switches, configuration of techniques trading output power capability for efficiency, configuration of average power tracking operation, and configuration of mode transitions. Significantly, the control information may be provided as, or may include, one or more digital control lines (DCL) on which are provided (DCL signals. Thus, the system may use digital signaling instead of analog signaling. This digital signaling approach (e.g., the use of DCLs and DCL signals) can support data transmission bandwidths which are higher (or wider) than those which can be achieved in an analog equivalent and enables a modem to operate with more power amplifiers 104 than an analog equivalent. In embodiments, the DCL signals may be upconverted (e.g. via a frequency translation operation) to a frequency (a so-called intermediate frequency) which is higher than the frequency of the DCL signal.

In embodiments, the control information may be provided as one or more DCL signals upconverted to an intermediate frequency for transmission along a transmission line (e.g. a coaxial transmission line), or by other means including, but not limited to any type of transmission line over which signals (including millimeter wave (MMW), radio frequency (RF), and intermediate frequency (IF) signals) may propagate.

Conventional differential analog signaling requires an envelope digital-to-analog converter (DAC) for each PA output on the transceiver. Implementation power and size of the envelope DAC grow with increasing bandwidth and multiply with the number of independent PAs supported.

The DCL approach replaces the envelope DAC with a digital signal output driver, which may be physically smaller (and in some cases substantially physically smaller) than digital-to-analog converters (DACs) and consume less power (and in some cases substantially less power) than DACs. Operation at very high bandwidth (e.g., bandwidths in the range of about 100 MHz, 200 MHz or even 800 MHz for present-day systems, and even higher bandwidth in future systems) is possible with a digital signal output driver. Thus, the DCL approach supports the use of multiple PAs (i.e. allows a modem to be used with multiple PAs) and supports the use of control signals having bandwidths which are higher than bandwidths of control signals used in an analog equivalent system.

In embodiments, the DCL signals may be provided to the PMC 110 over a signal path comprised of two or more electrical connections (i.e. two or more digital control lines). The PMC 110 has one or more output signals 114. Each of the one or more PMC output signals 114 is coupled to a bias terminal (e.g. a supply terminal) of at least one the RF amplifiers 104. In this example, the PMC output 114 is coupled to a single amplifier 104. However, in other embodiments multiple PMC outputs may be coupled to multiple RF amplifiers.

Each DCL input may be referred to as a logical supply modulator, and each VCC output may be referred to as a physical supply modulator. A logical supply modulator carries with it all configuration for the physical supply modulator such as configuration of multi-pulse transitions, configuration of general-purpose switches related to that output, configuration of average power tracking and other mode transitions, and so on. The mapping from logical to physical supply modulators can be reconfigured programmatically, such that any input can control any output. This is especially useful when multiple transceivers must have control over the same PA hardware (e.g. in the case where logical supply modulators may be hard wired to a given transceiver) or a single transceiver must have control over many different PA outputs under different circumstances. Additionally, this configuration allows the number of DCL inputs to be smaller than the number of VCC outputs.

In response to the DCL control signals, the PMC provides bias signals (e.g. a supply voltage) as outputs 114. The PMC output signals are coupled to bias terminals of the respective RF amplifiers. Thus, the PMC may provide one or several RF amplifiers with independently modulated supply voltage at discrete levels.

For example, the use of DCL signals significantly simplifies connection of the transceiver to PMC for scenarios requiring multiple PAs to operate simultaneously, such as is the case with multiple-input, multiple output (MIMO) systems, uplink carrier aggregation systems, array beamforming systems. DCL systems are also described in U.S. Provisional Patent Application No. 62/880,906 (filed Jul. 31, 2019), which is incorporated here by reference. Additionally, RF amplifier systems are described in U.S. Pat. No. 8,824,978 (filed Oct. 30, 2012), which is incorporated here by reference.

Figure 2:
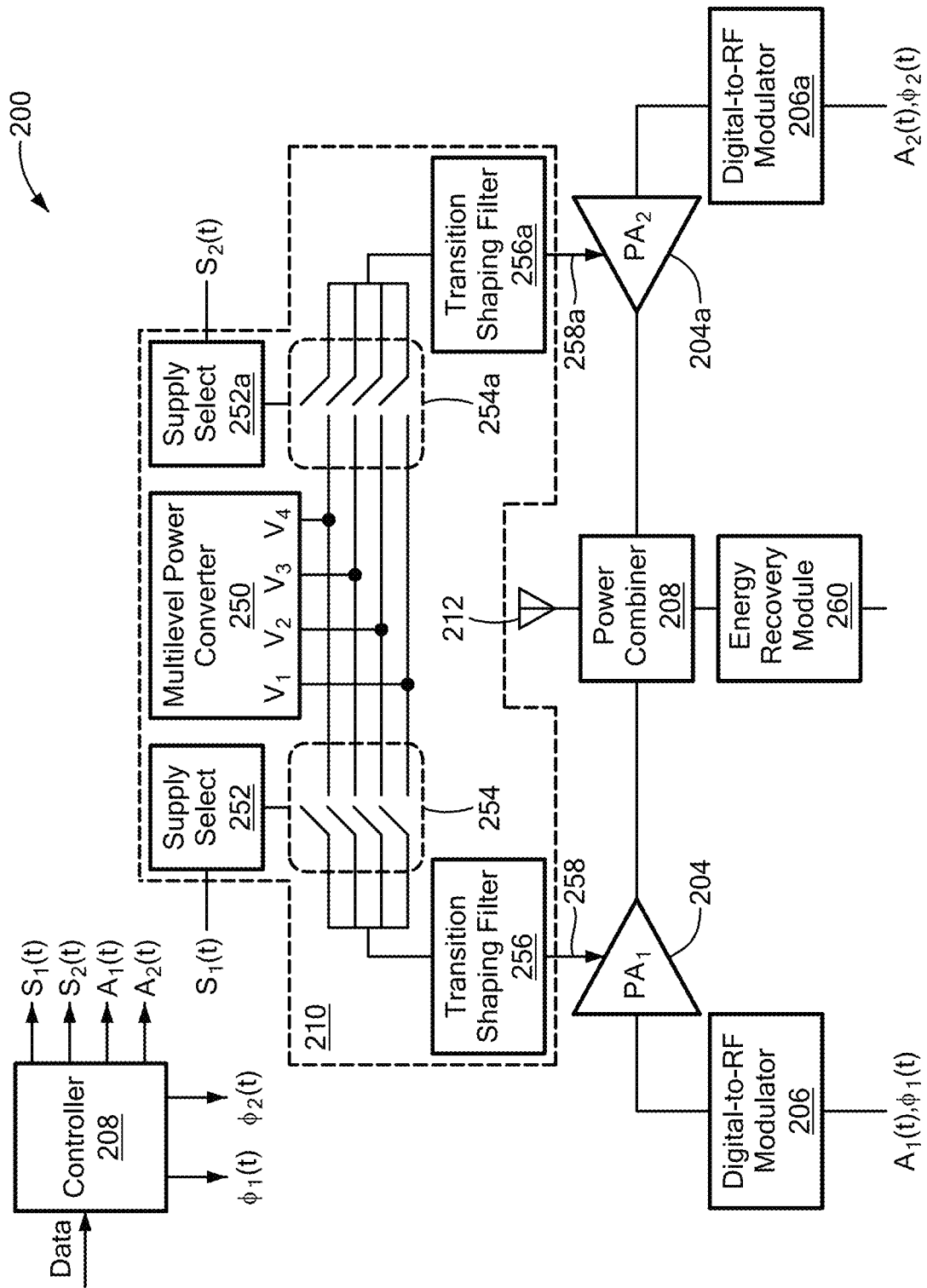
FIG. 2 is a block diagram of an RF amplifying system in which the power supply bias to multiple PAs is dynamically selected from multiple inputs depending upon one or more characteristics of signals to be provided to the RF inputs of the respective RF PAs.

Referring to FIG. 2, a system 200 for amplifying RF signals may be similar to the model 100 of FIG. 1. System 2 includes control circuit 208 and a PMC circuit 210. a multilevel power converter circuit 202. The PMC circuit 208 may include a multilevel power converter 250—e.g. a power supply or similar circuit with multiple outputs, each output having a different voltage level. The outputs of the PMC circuit 210 are coupled to bias ports of RF amplifiers 204, 204a. The outputs 204, 204a provide multiple, discrete, switchable power signals to the RF amplifiers based on the operation of the control circuit 208. The RF amplifiers receive RF signal from the digital-to-RF modulators 206, 206a. The system 200 also includes a power combiner circuit 260 that combines the power of the RF amplifiers and an energy recovery module 210 coupled to receive the output of the power combiner circuit 208 that combines the outputs of the RF amplifiers so they can be transmitted via a single RF antenna 212.

Combining could be done with an isolating power combiner or an isolating power combiner with an energy recovery system for the isolation port. Alternatively, the combining could be accomplished with a non-isolating combining, such as a Doherty combiner, a Chireix combiner or with another combiner comprising combinations of transmission line(s) and/or energy storage elements). In other exemplary systems with multiple power amplifiers, the two power amplifiers might each support different RF outputs (cg, for a MIMO system or for a balanced power amplifier system utilizing multiple PAS), one power amplifier may serve as a driver stage for the other power amplifier, or the two power amplifiers might be RF power combined to support a single high-power output (e.g., multiple watts, 10+ watts, or hundreds of Watts depending upon the application and system bandwidth). Moreover, while the example shows two power amplifiers, the system may include fewer or more than two power amplifiers and associated power supply elements.

The PMC circuit 208 also includes two supply select circuits 252, 252a coupled to receive control signals from control circuit 208. The supply circuits 252, 252a are coupled to respective power modulators 254, 254a. The modulators 254, 254a have multiple inputs coupled to the power outputs from multilevel power converter 252 a single output. The modulators act as selectable switches that connect one of the voltage levels from the multilevel power converter 250 to their respective output. The PMC circuit 208 also includes filters 256, 256a to filter and smooth the transitions of the voltage levels of the modulator outputs as the modulators switch.

The PMC circuit outputs 258, 258a provide multiple, discrete voltage levels to the RF amplifiers 204, 204a. In embodiments, the control circuit 208 will provide control signals to the PMC to control which power level is used to power the RF amplifiers 204, 204a. For example, the control circuit 208 will control signal $S_1(t)$ to the supply select circuits 252, 252a. In response to the control signal $S_1(t)$, the supply select circuits 252, 252a operate the modulators 254, 254a to route the selected power level to the PMC output signals 258, 258a.

The control circuit 208 may also provide the message (i.e. the signal that is to be transmitted via the antenna 212) to the digital-to-RF modulators 206, 206a as signals $A_1(t)$ and $A_2(t)$. These signals may be digital signals that are converted into RF signals by the digital-to-RF modulators 206, 206a prior to the signals being amplified by the RF amplifiers 204, 204a.

As noted above, embodiments of system 200 may include one, two, or more RF amplifiers. One skilled in the art will recognize that the PMC circuit 210 and/or the control circuit 208 may be modified to provide selectable, discrete power levels to one or more RF amplifiers.

Referring now to FIG. 1, a multilevel power amplifier system with a drain-voltage modulator and transition filter supplying an RF power amplifier. The switches can switch voltages among voltage levels V1, V2, V3. The transition filter shapes (smooths) the transitions in voltage $v_x$ such that the voltage $V_y$ provided to the power amplifier has smooth transitions with high-frequency content removed.

Figure 3A:
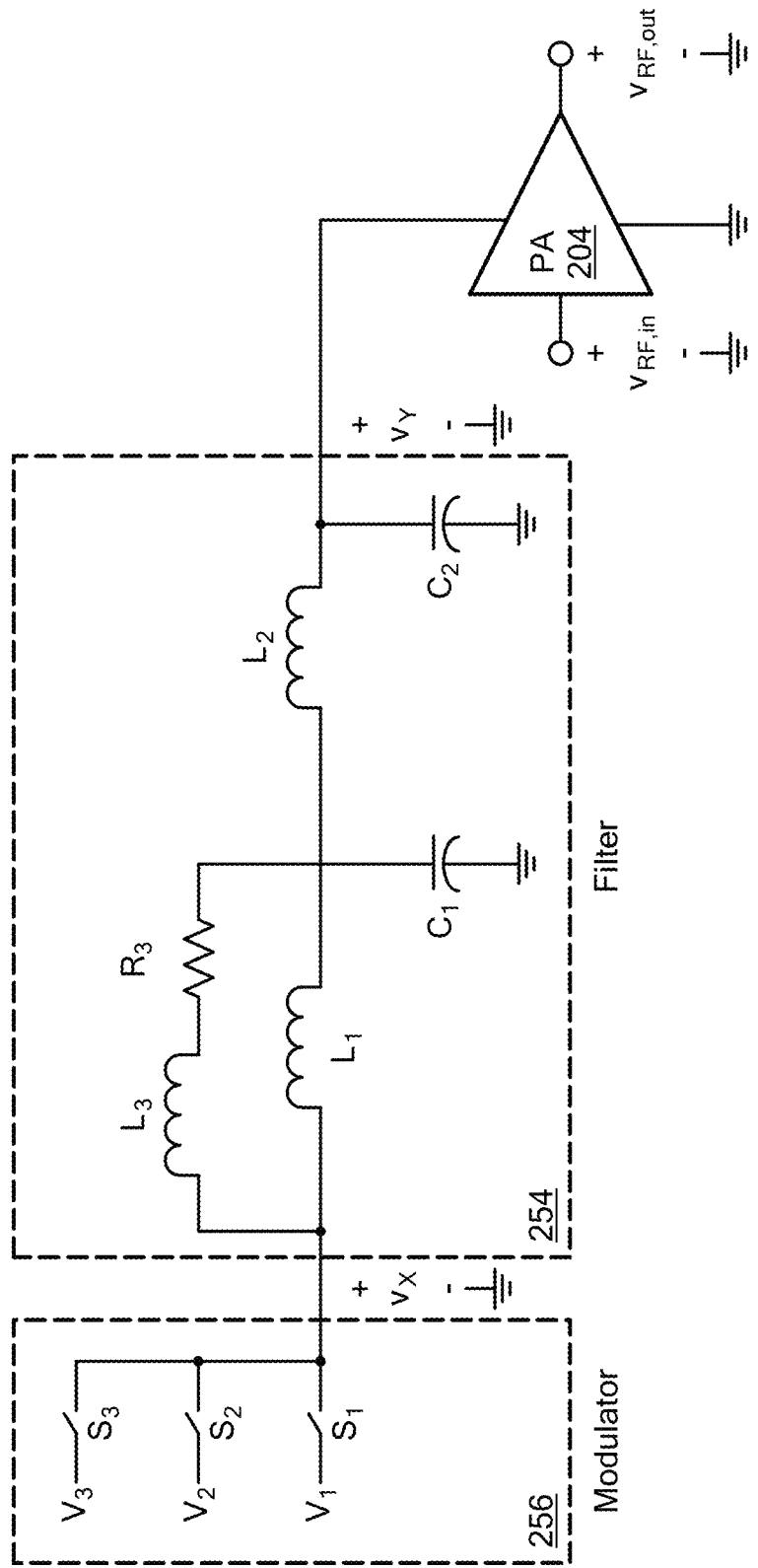
FIG. 3A is a schematic diagram of a multilevel power amplifier system having a drain-voltage modulator and transition filter supplying an RF PA and having switches capable of switching among a plurality of voltage levels V1, V2, V3 and wherein the transition filter shapes (smooths) the transitions in voltage $v_x$ such that the voltage $V_y$ provided to the PA (e.g. provided to a supply terminal of the PA) has smooth transitions with high-frequency content removed.

In FIG. 3A, filter 254 is illustrated in greater detail. As modulator 256 switches between the different voltage levels (shows a V1, V2, and V3 in FIG. 3A), the filter circuit 254 shapes (e.g. smooths) the transitions between voltages so that the RF amplifier 204 receives smooth voltage transmissions. This can reduce EMI, signal interference, noise, and other unintentional signal aberrations caused by fast power switching.

Figure 3B:
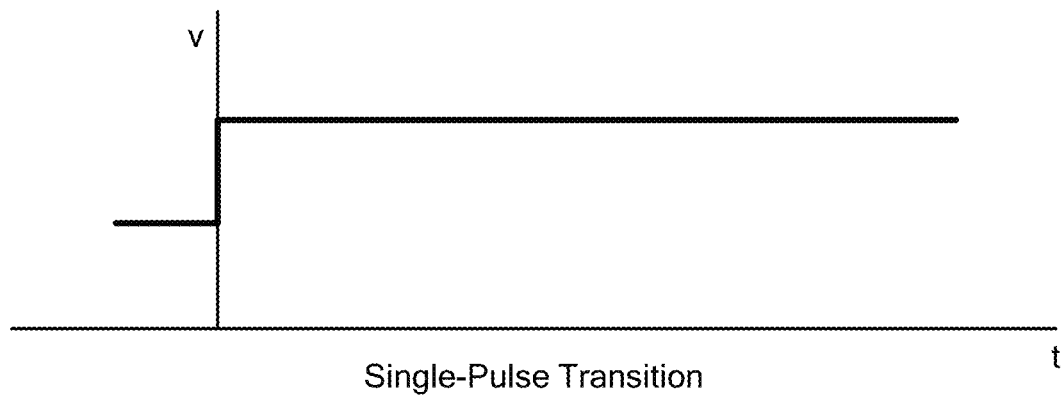
FIGS. 3B, 3C, and 3D are plots of pulse transitions.
Figure 3C:
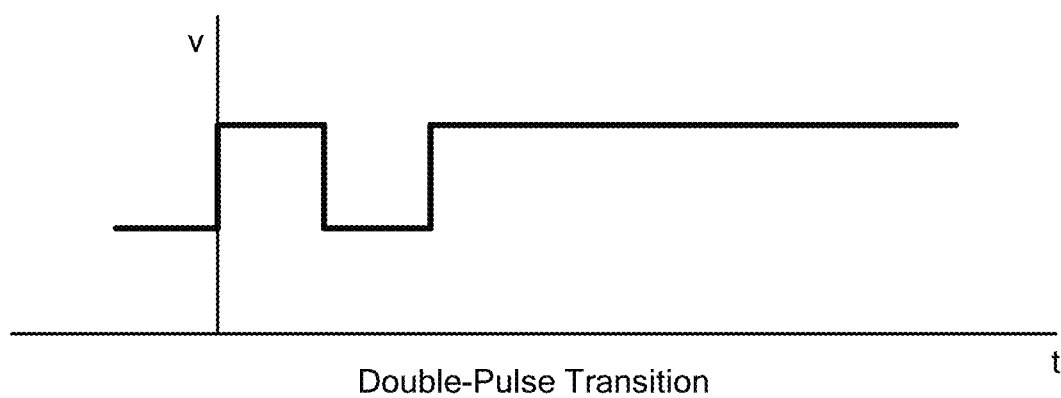
Figure 3D:
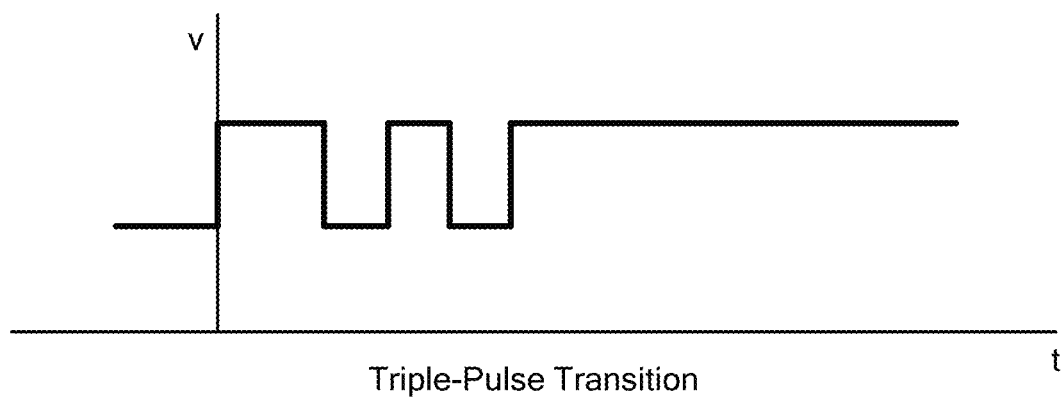

Referring now to FIGS. 3B-3D, switching patterns for transitions among levels (e.g., as might be observed in voltage $v_x$ in FIG. 3A). A "single-pulse" transition (FIG. 3B) represents a standard switch among levels. A "double-pulse" transition (FIG. 3C) enables improved shaping of the frequency content of the resulting output waveform, at the expense of higher switching loss for the transition. Higher numbers of pulses may be used in a transition (e.g., the "triple-pulse" transition ((FIG. 3D), or more generally the "n-pulse" transition, n>1).

Figure 4A:
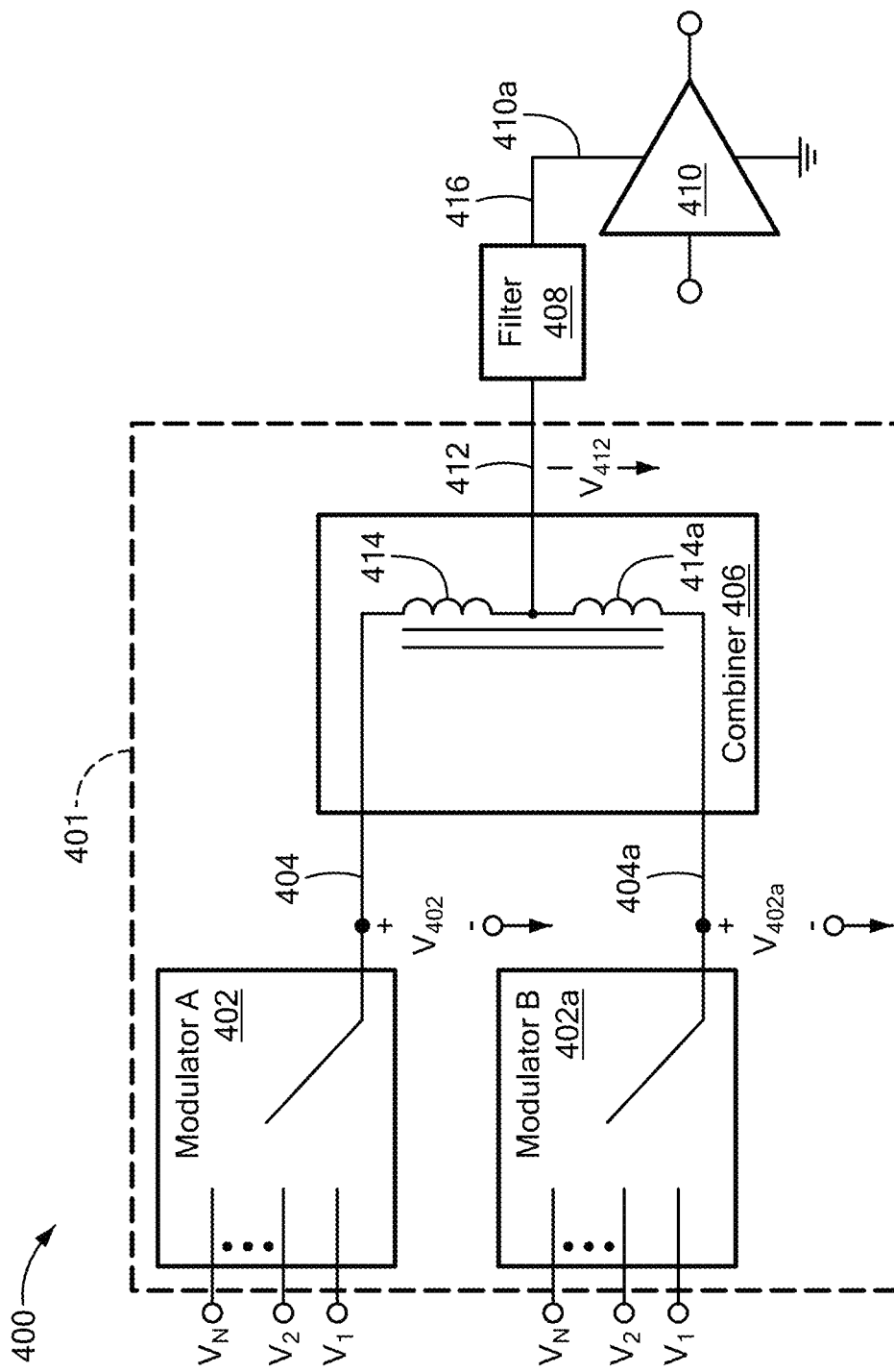
FIG. 4A is a block diagram of a multilevel power amplifier system including two supply modulators and a combiner.

Referring to FIG. 4A, a system 400 that addresses both high transition-rate/fast response and low transition-rate/reduced frequency content may utilize split transitions. For example, operation with a fast response case may represent using at least twice as many transitions per second as a case with reduced frequency content. It should thus be appreciated that there could be two or more desired operating conditions. For example, one operating condition for a relatively high bandwidth and a second different operating condition for a reduced bandwidth but requirement for low noise.

System 400 includes a split transition circuit 401 which may comprise a plurality of discrete modulators with two discrete modulators 402, 402a being shown in the example embodiment of FIG. 4A. Each of modulators 402, 402a is configured to select from among discrete levels $V_1$-$V_N$ at respective inputs thereof. Thus, modulator 402 provides a first modulated power supply output signal at an output 404 and 402a provides a second modulated power supply output signal at an output 404a. It should be noted that signals $V_1$-$V_N$ may be provided by the same or different power supplies (i.e. a single power supply may provide voltages $V_1$-$V_N$ to inputs of both modulators 402, 402a or a first power supply may provide voltages $V_1$-$V_N$ to the inputs of modulator 402 and a second different power supply may provide voltages $V_1$-$V_N$ to the inputs of modulator, 402a.

Regardless of the manner in which signals $V_1$-$V_N$ are provided or otherwise made available to inputs of modulators 402, 402a, the outputs 404, 404a of the modulators are coupled to a combiner circuit 406. Thus, the first and second modulated power supply output signals are provided at respective ones of modulator outputs 404, 404a and may be combined by combiner circuit 406. Combiner circuit 406 combines the signals provided thereto and provides a combined power supply output signal (i.e. a split transition signal), examples of which are described below in conjunction with FIG. 5. Thus, in this example embodiment, the first and second modulated power supply output signals are combined prior to the output signals propagating to a bias port 410a of the amplifier 410 and accordingly, a split transition signal is provided to bias port 410a of the amplifier 410.

In this example embodiment, the output of the combiner circuit 412 is coupled to amplifier bias port 410a through an optional filter circuit 408. Filter circuit 408 filters the split transition signals to smooth the transitions of the voltage at the bias port of the amplifier 410.

Modulators 402, 402a may be the same as or similar to modulators 252, 252a (FIG. 2). Also, the combiner 406 may be the same type or similar to combiner 208, filter 408 may be the same as or similar to the filter 254, and amplifier 410 may be the same as or similar to amplifiers 204, 204a. It should be appreciated that while two modulators are shown in FIG. 4A, in other embodiments three or more modulators may be used with the outputs of the three or more modulators being combined via one or more combiner circuits so as to provide a combined power supply output signal which is coupled to bias port (e.g. a drain terminal) of an RF amplifier.

It should also be appreciated that combiner circuit 406 may be provided as any means capable of combing two or more modulated power supply output signals provided thereto so as to provide a split transition signal appropriate for use in an application of interest. Examples of such combining means, (but not an exhaustive list of examples) ae provided below. After reading the disclosure provided herein, one of ordinary skill in the art will appreciate how to select or design a means for combining appropriate for use in a particular application.

In this illustrative embodiment, the combiner circuit 412 is provided as a coupled magnetic structure having a high coupling (e.g., coupling coefficient in the range or about 0.5 or greater or in some applications, it may be desirable or necessary to utilize a coupling coefficient in the range of about 0.9 or greater) between the windings 414, 414a (e.g. an interphase transformer combiner). The output 412 of the combiner is a linear combination of the inputs from the individual modulators 402, 402a. By timing the inter-level transitions of the modulators appropriately, energy at certain frequencies in the combiner output waveform can be substantially (and ideally, completely) canceled. The combiner circuit 406 is not limited to interphase transformer combiners. It may comprise, for example, uncoupled magnetics (e.g., separate inductors or uncoupled windings on a single core structure), a transmission-line transformer combiner, a lumped or distributed GF combiner or hybrid circuit, or another three-port lumped or distributed passive network. Also, while two modulators and a two-way combiner are shown in FIG. 4A, the system may include M modulators and an M-way combiner. This may allow for increasingly high performance (e.g., reduced content of undesired frequencies for a given desired frequency content.) as M is increased.

The circuit design illustrated in FIG. 4A can implement energy cancellation via split timing of the transitions of the two modulators, resulting in improved frequency content of $V_{o,net}$ and of a PA drain voltage, without increasing the net transition energy or high-frequency content of $V_{o,net}$ as occurs with the approach illustrated in FIGS. 4B-4G.

As previously noted, voltages $V_1$-$V_N$ may be made available to the inputs of the two or more modulators using a variety of different techniques and it should be appreciated that system 400 may operate to provide a combined power supply output signal (i.e. a split transition signal) regardless of the manner in which voltages $V_1$-$V_N$ are provided to the inputs of the two or more modulators. Some systems seeking to improve efficiency switch among amplifier bias voltages having discrete transitions (i.e. discrete transitions switching between the various available voltages $V_1$-$V_N$) among a set of operating states, such as an RF amplifier system in which the drain bias voltage for one or more power amplifiers is dynamically selected from more than one possible signal source or signal level. This includes systems where the drain voltage of at least one RF amplifier (e.g. at least one RF power amplifier) is selected (e.g., via switches) from among multiple discrete supply voltages (e.g. voltages $V_1$-$V_N$).

It should be appreciated that discrete output states can also be realized through systems in which the drain voltage is derived from a DC-DC converter that has a plurality of preferred discrete output voltage levels (e.g. voltage levels $V_1$-$V_N$). As also noted elsewhere herein, the efficiency of RF power amplifiers can be improved through a "supply modulation" technique (sometimes also referred to as "drain modulation" or "collector modulation"). In such a technique, a power supply voltage provided to the power amplifier is adjusted dynamically ("modulated") over time depending upon the RF signal being synthesized. For the largest efficiency improvements, supply voltage can be adjusted discretely (among discrete levels) or continuously on a short time scale that tracks or dynamically accommodates rapid variations in RF signal amplitude (or envelope), such as may occur as data is encoded in the RF signal or as the RF signal amplitude is desired to be changed with high envelope bandwidth (e.g., as in envelope tracking, envelope tracking advanced, polar modulation, "class G" power amplification, multilevel backoff, multilevel LINC, Asymmetric Multilevel Outphasing, etc.). The power supply voltage (or voltage levels) provided to the power amplifier may also be adapted to accommodate longer-term changes in desired RF envelope (e.g., "adaptive bias") such as associated with adapting transmitter output strength to minimize errors in data transfer, for RF "traffic" variations, etc. Regardless of the manner in which voltages $V_1$-$V_N$ are provided to the inputs of the two or more modulators, it should be appreciated that system 400 may operate to provide a combined power supply output signal (i.e. a split transition signal) which may be coupled or otherwise provided to an RF amplifier.

Figure 4B:
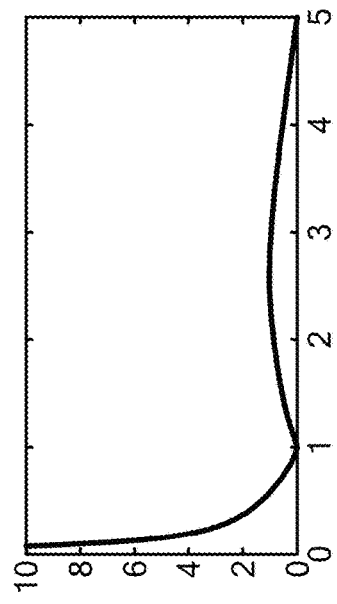
FIGS. 4B-4G are plots of time-domain response and frequency-domain magnitude content associated with different voltage transition patterns.
Figure 4C:
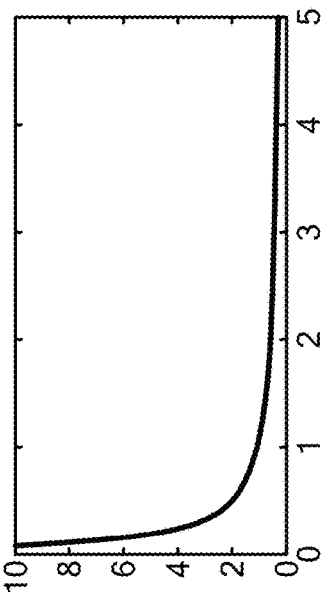
Figure 4D:
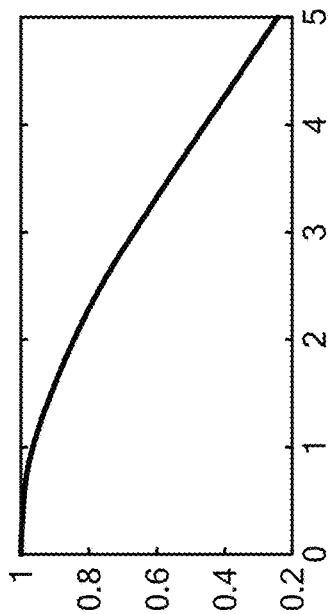
Figure 4E:
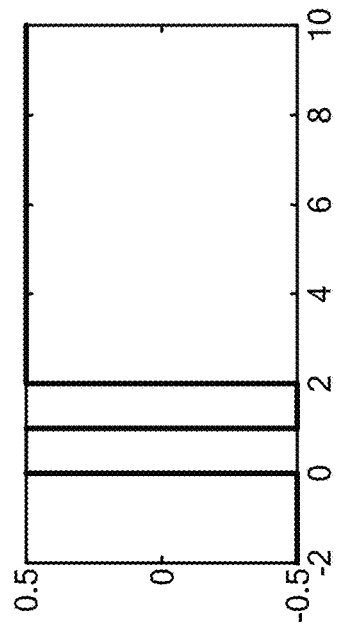
Figure 4F:
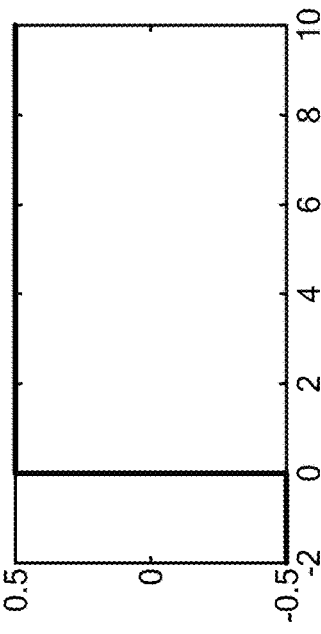
Figure 4G:
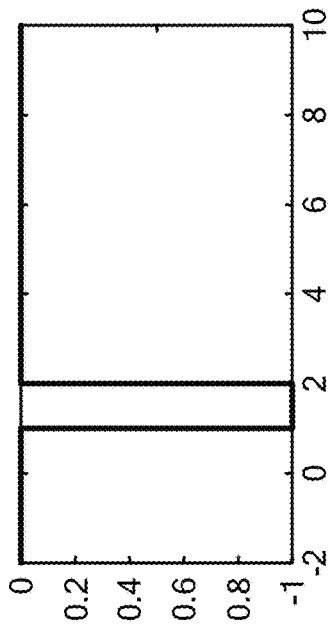

FIGS. 4B-4G illustrate a time-domain response (FIGS. 4B-4D) and frequency-domain magnitude content (FIGS. 4E-4G) associated with different voltage transition patterns (considering only the ac content). FIGS. 4B, 4E illustrate a double-pulse voltage transition while FIGS. 4C, 4F illustrate a single transition and FIGS. 4D, 4G illustrate a pulse representing the difference between the double-pulse transition and the single transition. It can thus be seen that using the double-pulse transition enables a null (or small-amplitude region) to be placed in the frequency domain thereby reducing (and ideally, "eliminating") energy in that frequency region, which can make filtering easier.

Figure 5:
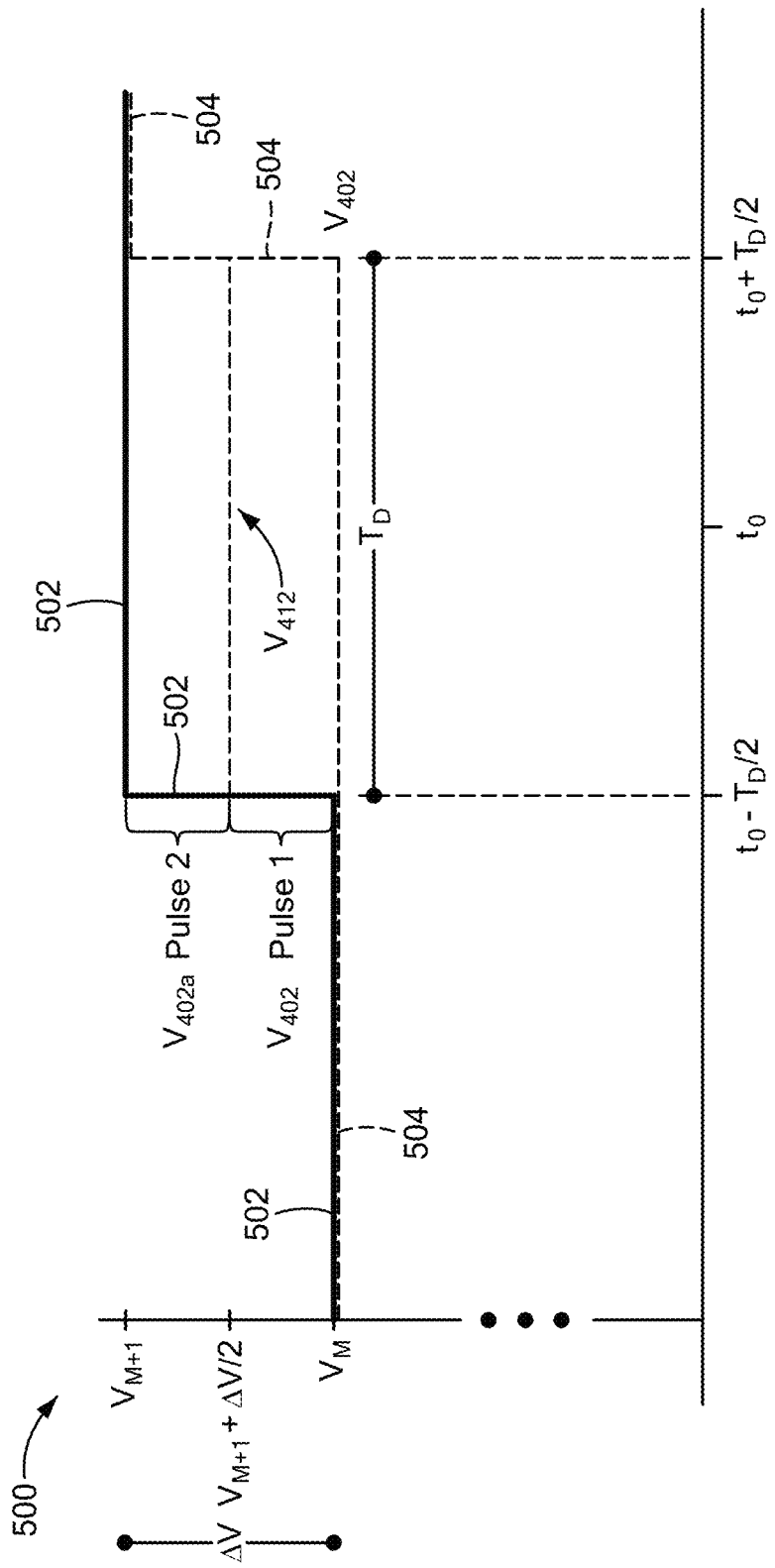
FIG. 5 is a plot of a voltage vs. time illustrating split transition waveforms for the system of FIG. 4A.

Referring also to FIG. 5, in operation, system 400 may modulate the voltage signal 416 to the amplifier 410 using split transitions—i.e. using delayed timing in the transition of the first and second modulated power supply output signals provided by respective ones of modulators 402, 402a in FIG. 4A. For example, as shown in plot 500, during a transition of each of modulator from having an output voltage $V_M$ to a voltage $V_M+1$ (where voltage $V_M+1$ is $\Delta V$ volts higher than voltage $V_M$), the transition of modulator 402 may take place at a time $t_0-T_D/2$ (see curve 502), while the transition of modulator 402a takes place at a time $t_0+T_D/2$, where TD is the time delay between the transitions of the two modulators: For an ideal combiner (e.g. combiner 406 in FIG. 4A), the output waveform of the modulator (denoted $V_{412}$ in FIGS. 4A and 5 as measured at the output 412 of the combiner 406) is the average of the two modulator outputs $V_{402}$ and $V_{402a}$ (corresponding to the respective voltage outputs of modulators 402, 402a. Thus:

$$V_{412} = \frac{V_{402} + V_{402a}}{2} \qquad (1)$$

This is illustrated in FIG. 5. This transition may also be viewed as a multi-pulse transition with a first pulse in the output of the combiner $V_{412}$ from the step from $V_M$ to $V_M+\Delta V/2$ and a second pulse from the step from $V_M+\Delta V/2$ to $V_{M+1}=V_M+\Delta V/2$ (denoted as pulse 1 and pulse 2 in FIG. 5). Thus, FIG. 5 illustrates example split transition waveforms (e.g. appropriate for use in a system which may be the same as or similar to the system of FIG. 4A) in which the timing of the transition for a first modulator is displaced from that of a second modulator by a time $T_D$, thereby enabling a partial or full reduction (or cancellation) of undesired energy in the combined output waveform.

It should be appreciated that while FIG. 5 shows a split transition waveform in which each of the modulator outputs 402, 402a use single-pulse transitions as in FIG. 3a, the modulator outputs 402,402a could use double- or triple-pulse transitions as in FIG. 3c and FIG. 3d (or even higher number of pulse transitions). This provides the opportunity to achieve even further reduction in undesired frequency content in the combiner output 412. In this case, the multi-pulse nature of the individual transitions can be used to achieve one or more frequency nulls (e.g., as shown in FIG. 4E for a double-pulse transition) and the delay between 402,402a can be used to achieve a further frequency null which may be placed at the same frequency, a nearby frequency, or a second frequency of interest.

Figure 6A:
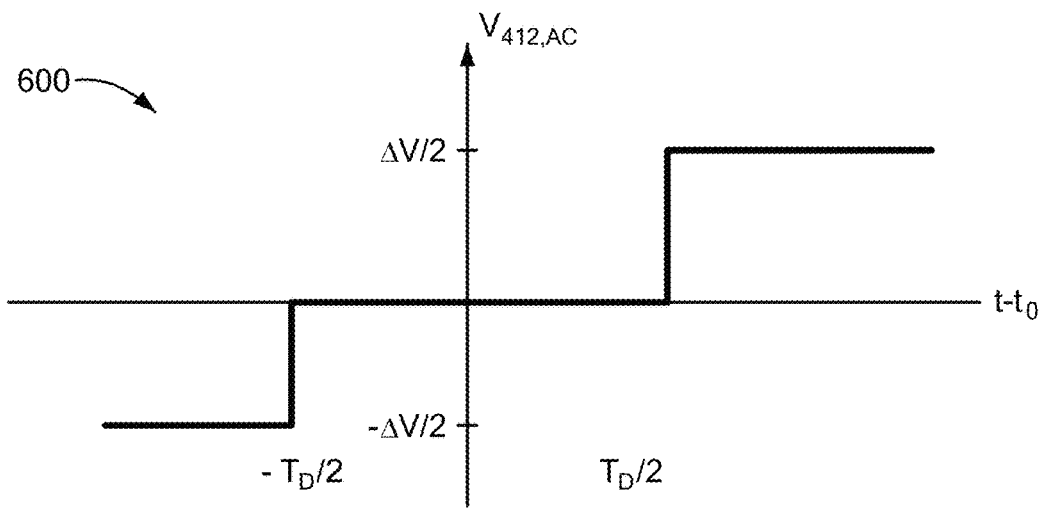
FIG. 6A is a plot illustrating the ac component of the combiner output voltage in FIG. 4A for the transition shown in FIG. 5.
Figure 6B:
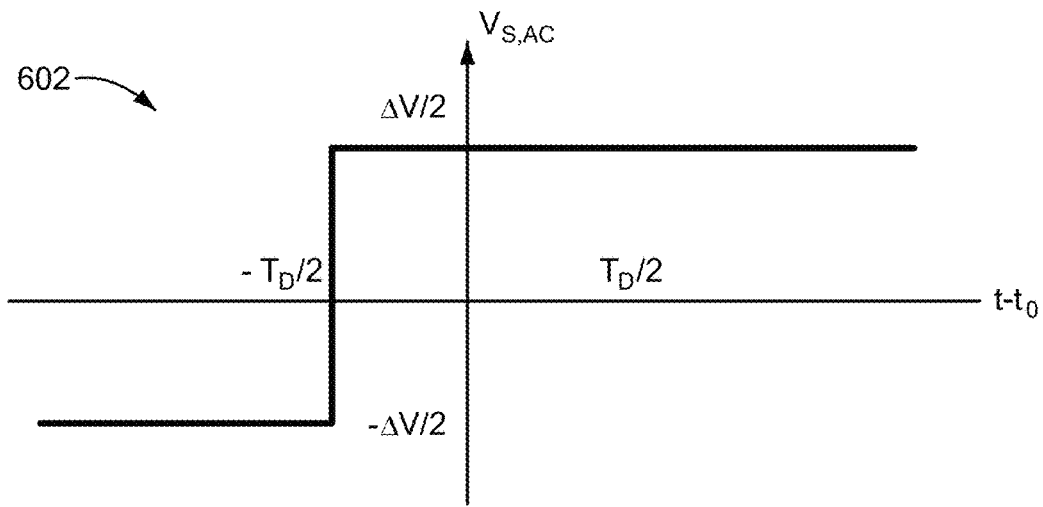
FIG. 6B is plot illustrating that the output transition of FIG. 6A can be expressed as the sum of a step $v_{s,ac}(t)$ (where only ac components are considered).
Figure 6C:
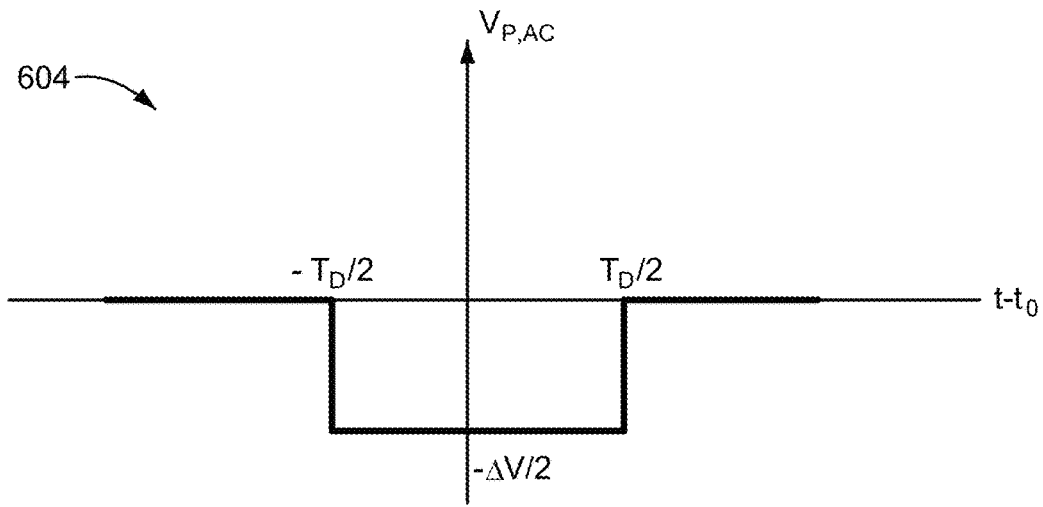
FIG. 6C is a plot illustrating that the output transition of FIG. 6A can be expressed as a pulse $v_{p,ac}(t)$ (where only ac components are considered).
Figure 7A:
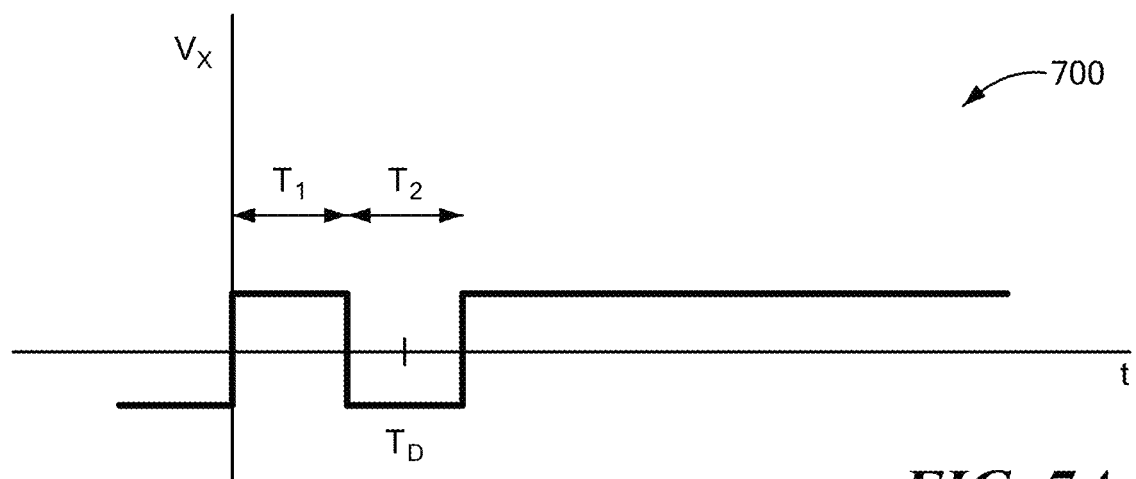
FIG. 7A-7C are a series of plots of a multi-pulse transition to an amplifier.
Figure 7B:
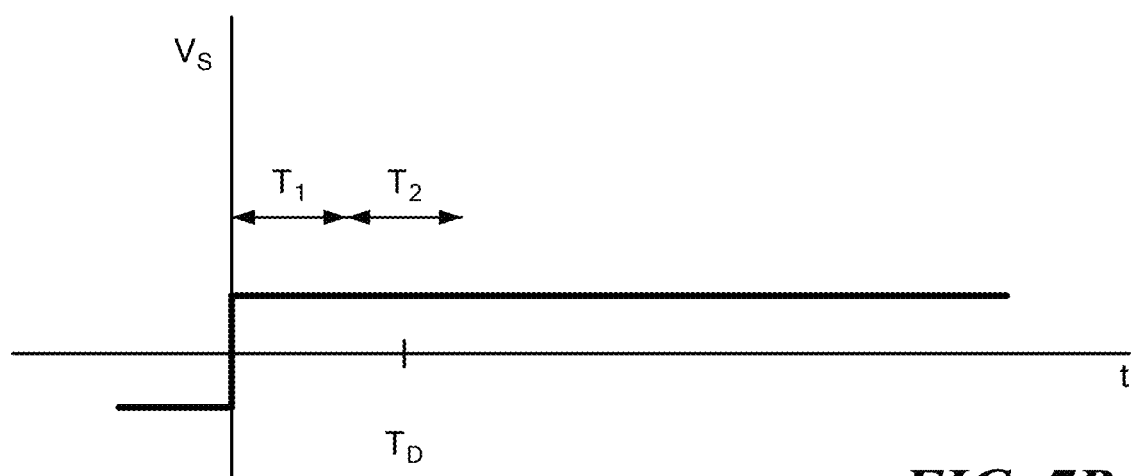
Figure 7C:
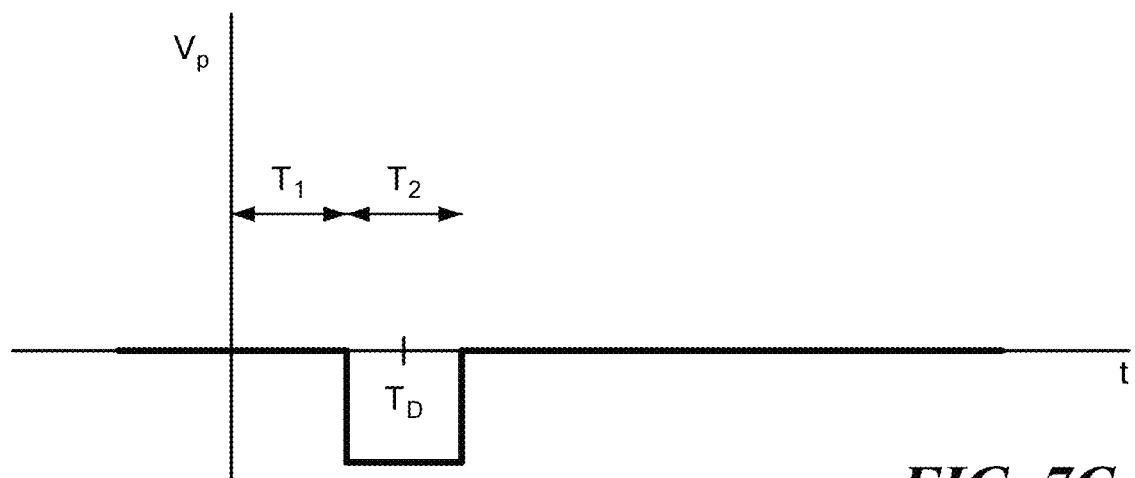

Referring to FIG. 6, the top plot 600 shows the AC component of the combiner output voltage 412. The output transition shown in plot 600 can be expressed as the sum of a step (plot 602) and a pulse (plot 604), where only the AC components are considered. Because the combiner allows a vertical pulse amplitude of $\Delta V/2$, undesired energy content of the net waveform owing to the split transition can be smaller than that from other transition schemes like, for example, a double pulse transition (e.g. plot 700 in FIG. 7A) which may be characteristic of systems that do not employ split transitioning, such as system 100 shown in FIG. 1. In addition, because of the allowed sizing of the modulators in FIG. 4A (half sized in terms of current rating compared to that of FIG. 3), the net transition loss can be reduced and can be lower than the transition loss associated with plot 700 (i.e. the net transition loss can be lower for the transition of FIG. 5 than for that in FIG. 7A). Although a transition from a lower to a higher voltage is shown in plot 600 (FIG. 6A), one skilled in the art will recognize that system 400 can apply the same advantages to a transition from a higher voltage to a lower voltage.

Referring again to FIG. 4A, in an example, modulators 402 and 402a may have the same switching pattern, but modulator 402a may have its switching time delayed by time $T_D$ with respect to modulator 402. If the output pattern of modulator 402 has frequency content $V_{402}(jw)$, then the output of modulator 402a has frequency content:

$$V_{402a} = V_{402} e^{-jwT_D} \quad (2)$$

Thus, the frequency content of the output 412 of the combiner 402 may be:

$$V_{412} = V_{402}(jw)e^{-jw\frac{T_D}{2}}\cos\left(\frac{\omega T_D}{2}\right) = V_{402a}(jw)e^{jw\frac{T_D}{2}}\cos\left(\frac{\omega T_D}{2}\right) \quad (3)$$

As shown, the output 412 of the combiner 406 has the frequency content of the individual modulators 402, 402a (given a time delay and time advancement) times a factor of $$\cos\left(\frac{\omega T_D}{2}\right).$$

As a result, the transfer function through the combiner 406 may be:

$$H(jw) = \cos\left(\frac{\omega T_D}{2}\right)e^{-\frac{jwT_D}{2}} \quad (4)$$

for which the magnitude is:

$$|H(jw)| = \left|\cos\left(\frac{\omega T_D}{2}\right)\right| \quad (5)$$

This transfer function is null at an angular frequency $\omega_z$, where:

$$\omega_z = \pi/T_D \quad (6)$$

or, equivalently, at a frequency $f_z$, where:

$$f_z = 1/2T_D \quad (7)$$

The magnitude may be close to 1 for frequencies below this value $f_z$. Therefore, by selecting a time delay $T_D$ between the modulators, a selected null frequency may be generated on the combiner output 402 waveform that is applied to the amplifier 410 by choosing a delay value $T_D$ for the split transitions.

In another example, split transitions with energy cancellation at desired frequencies may be used in conjunction (e.g. simultaneously or in a coordinated fashion) with multi-pulse transitions (e.g. plot 700). This may result in a null frequency from energy elimination multi-pulse transitions at ox at, below, or above the null frequency $\omega_z$ from split transition energy cancellation. Choosing values so that both attenuated frequencies overlap can provide increased attenuation at a desired frequency. Alternatively, choosing values so that both attenuated frequencies are near and/or slightly overlap can provide attenuation over a broader frequency range. As another example, choosing values so that the attenuated frequencies do not overlap can provide attenuation over two separate frequency bands. Control of the attenuation can be further expanded by increasing the number of pulses in the multi-pulse transition and/or increasing the number of modulators with delayed/split transitions.

Figure 8:
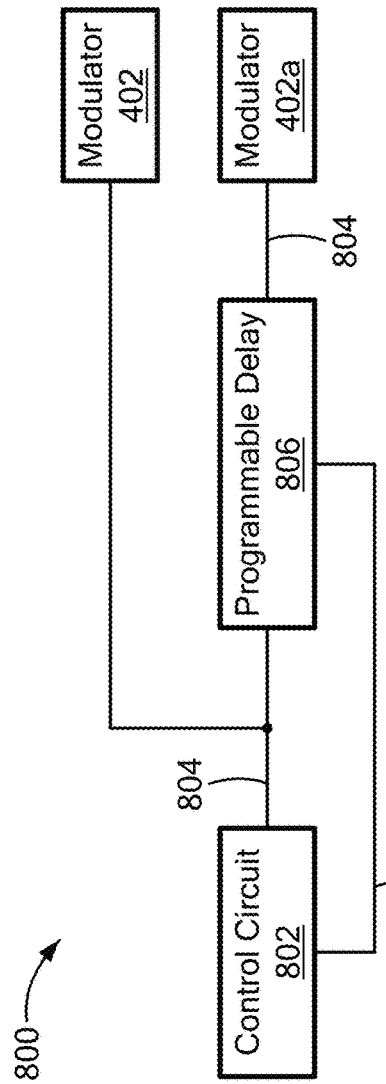
FIG. 8 is a block diagram of a circuit that splits and delays control signals to modulators.

FIG. 8 illustrates a control implementation for split transitions. Control signals as needed for a single modulator are split into a plurality of paths (with two paths being shown in this example), with one path coupled to a first modulator (thereby allowing control signals to be transmitted to the first modulator), and the second path coupled to a second modulator (thereby allowing control signals to be transmitted to the second modulator) through a controllable delay block (or programmable delay block) that delays each of the control signals in that path by a controllable/programmable time TD, whose output transmits the delayed controls to a second modulator.

Referring to FIG. 8 and FIG. 4A, circuit 800 implements a split transition between modulators 402 and 402a. A control circuit 802 (which may be the same as or similar to control circuit 208) may provide a switching control signal 804 that triggers switching of the modulators 402, 402a. In this example, the control signal line is split into two paths. The signal 804 may be provided directly to modulator 402. However, a programmable delay circuit may delay the signal 804, generating a delayed signal 804' relative to signal 804. This delayed signal 804' is received by modulator 402a. In embodiments, control circuit 802 may control the programmable delay circuit 806a via a control signal 808 to statically or dynamically set the delay $T_D$. This may allow the circuit 800 to dynamically change the transfer function of the system and choose which frequencies to attenuate based on current operation of the system. In various embodiments, the control signal 808 may comprise a desired digital command such as through a MIPI RF Front-End Control Interface (RFFE).

The programmable delay circuit 806 may be implemented in various ways, such as by using one or more programmable delay lines. In one example, the programmable delay circuit 806 may include one or more current-starved inverter chains for each signal to be delayed, where the degree of current starving of the inverter chains are programmable to set the desired delay time.

In embodiments, the delay time $T_D$ by which programmable delay circuit 806 delays the control signal 804' can be selected to mull a desired frequency (or frequency range) at the amplifier output, thus allowing the system to dynamically and/or programmatically attenuate undesired frequencies in the RF output. (See equation (6) above).

In another embodiment, circuit 800 may have a second programmable delay circuit (not shown) between control circuit 802 and modulator 402, that can be individually controlled by control circuit 802. Additionally, the system may be expanded, as described above, by adding one or more additional modulators. Each modulator may be coupled directly to the control lines from control circuit 802. Alternatively, there may be additional programmable delay circuits coupled between the control circuit 802 and any of the additional modulators. Each delay circuit can be controlled by the control circuit 802 to provide a desired delay to the modulator's transition, and thus a desired frequency attenuation at the amplifier.

Figure 9:
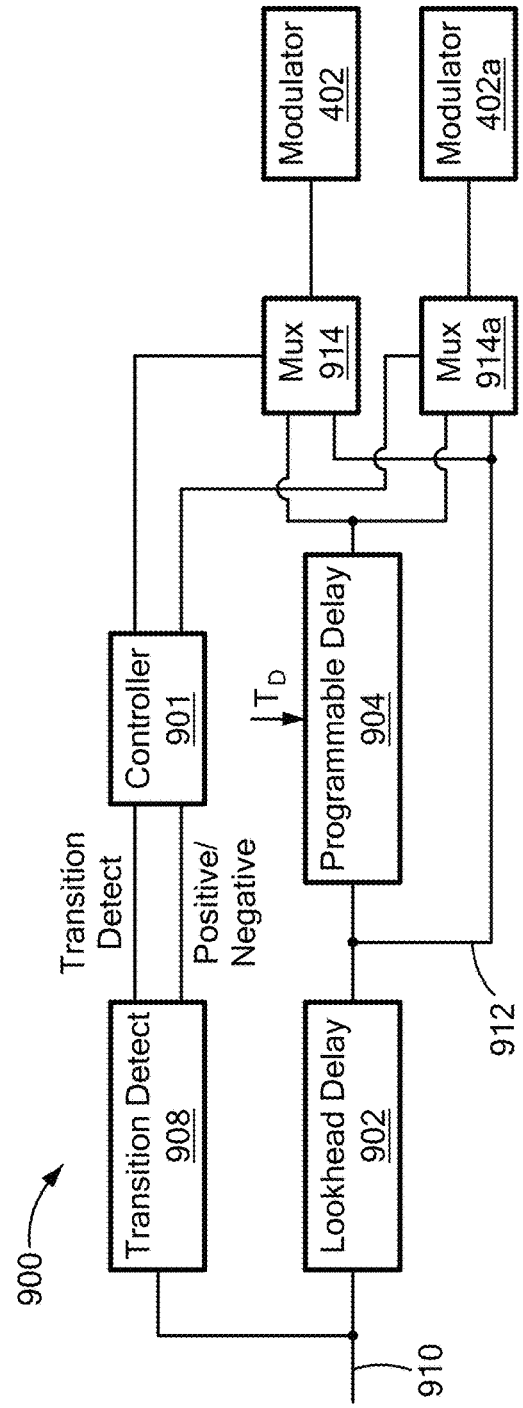
FIG. 9 is a block diagram of another embodiment of a circuit that splits and delays control signals to modulators.

Referring to FIG. 9, another embodiment of a split transition circuit 900 for delaying the transitions of modulators 402, 402a includes a control circuit 901, which may be the same as or similar to control circuit 802. The circuit 901 includes a lookahead delay circuit 902 coupled to a programmable delay circuit 904 and to the modulators 402, 402a. A transition detect circuit 908 is coupled to provide a signal to the controller 901 when a transition occurs on the input line 910. The control circuit 900 also includes multiplexor A and multiplexor B (e.g. multiplexers 914, 914a) that act as a selector for implementing the split transitions.

If volt-seconds are defined as the maximum of the time integral of the voltage difference between the outputs of the modulators 402, 402a (e.g. $V_{402}-V_{402a}$ in FIG. 4A), then the maximum volt-seconds may be reduced by circuit 900 relative to circuit 800. For example, in circuit 800, the maximum volt-seconds may be:

$$VS_{max}=(N-1)\Delta VT_D \quad (7)$$

The circuit 900 may reduce the value of VSmax to a value as small as $\Delta V-T_D$, which may be desirable in certain applications.

To accomplish this, the control circuit 901 may dynamically select which modulator transition to delay by $T_D$ in a given switching transition such that the combined output signal remains the same but the volt-seconds at the combiner 406 input is reduced. In one example, the control circuit 901 operates so that the volt-seconds change on the combiner input is negative if the net volt-seconds on the combiner input was positive in the past transition, and so that the volt-seconds change on the combiner input is positive if the volt-seconds on the combiner input was negative in the past transition. The control circuit 901 may also maintain the combined signal at the output of the combiner.

One approach to this technique is for the control circuit 902 to approximate the volt-seconds information by keeping a counter that increments on a transition when volt-seconds applied to the combiner has a positive change and decrements when volt-seconds applied to the combiner on a transition has a negative change. The transition detect circuit 908 and/or lookahead delay circuit 902 may allow the controller to determine if a transition had positive or negative volt-seconds and increment or decrement the counter accordingly. For example, the lookahead delay circuit 902 allow the control circuit 908 to determine what direction (e.g. positive or negative volt-seconds) the next upcoming transition will be, while providing time for the control circuit 908 to dynamically select which modulator signal transition to delay by a programmable time $T_D$. The transition detect circuit 908 detects the upcoming transition and provides a signal to the controller indicating that a transition is imminent and which direction (i.e. a higher voltage or a lower voltage) the transition will be. The control circuit 901 may utilize this information to determine which modulator should receive a delayed transition in its DCL control signals for the upcoming transition.

The programmable delay circuit 902 may also provide an output signal 912 that is a version of the DCL control signals. The signal 912 may be delayed by a further programmable time $T_D$. One or more switches or multiplexors 914, 914a may be coupled to the provide output signals to the modulators 402, 402a used by the control circuit to dynamically determine which modulator receives the delayed control signal and which receives the non-delayed control signal.

Thus, FIG. 9 illustrates a control system for implementing split transitions with small volt-seconds imposed upon the combiner. The control system includes a lookahead delay and transition detector, a programmable delay block, a controller that may be implemented in a state machine and a selector that may be implemented with a set of multiplexors.

Figure 10:
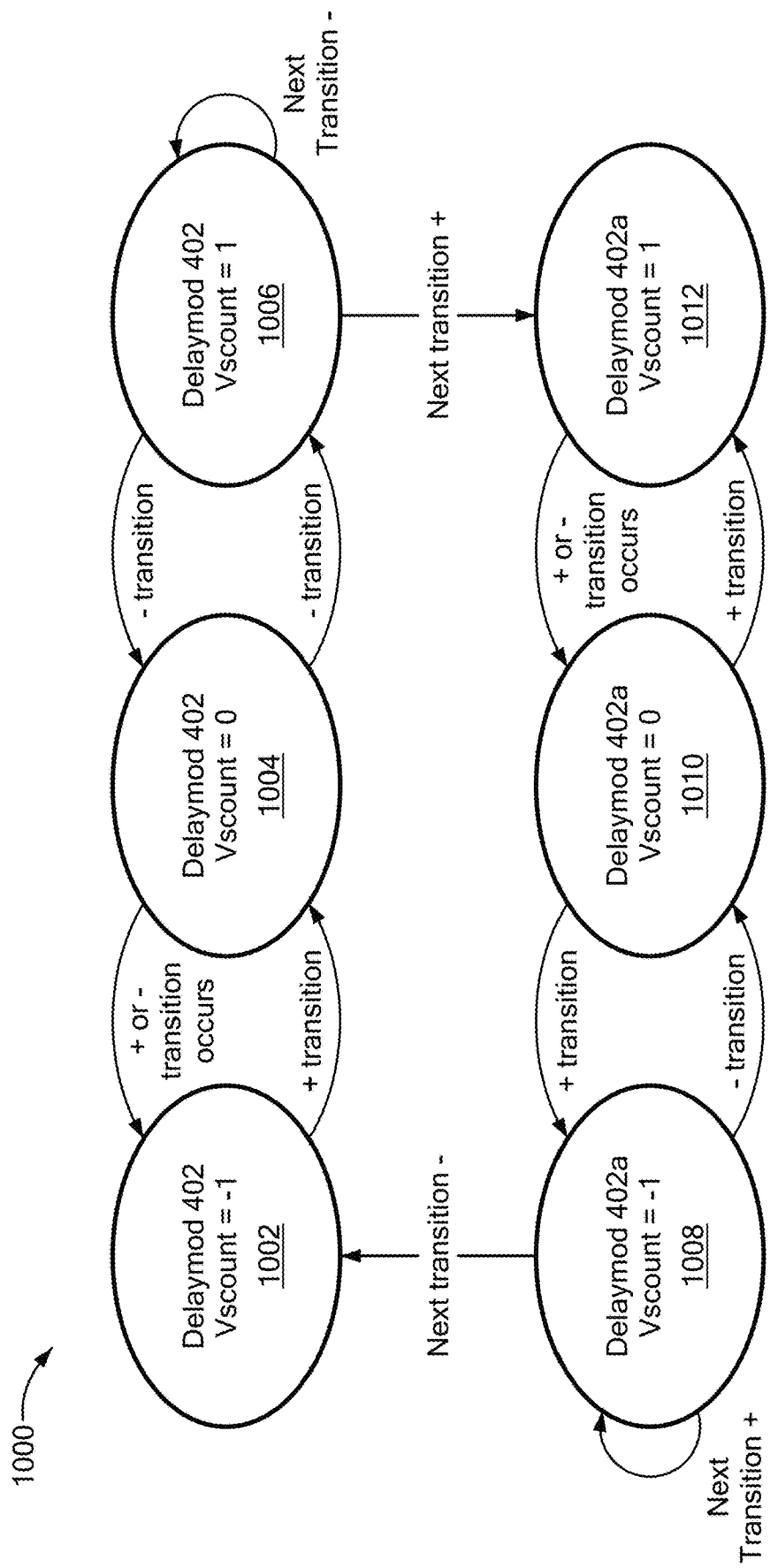
FIG. 10 is a state diagram for control of the circuit shown in FIG. 9.

Referring to FIG. 10, shown is a state diagram for a controller (such as controller 901 in FIG. 9) for implementing split transitions with small volt-seconds imposed upon the combiner, such as may be used with the control system of FIG. 9. The controller utilizes a counter to track the state of volt-seconds on the combiner. It changes state when an imminent level transition is detected, selecting a new state that provides the desired output while reducing the magnitude of volt-seconds at the combiner. In FIG. 9, control circuit (or controller) 901 may implement state machine 1000 to control the split (e.g. delayed) transition control circuit 900. The control circuit 901 may change state when an imminent level transition is detected and select a new state that provides the desired output while reducing the magnitude of volt-seconds at the combiner.

As described above, the control circuit 901 may utilize a counter (with value viscount, in this example) to track whether the combiner volt seconds is positive, negative or zero. During each state either modulator 402 receives the delayed timing signal (DelayMod 402) or modulator 402a receives the delayed timing signal (DelayMod 402a), where the delay is programmable to a value $T_D$ as described above. The lookahead delay circuit 902 may provide information about the upcoming transition sufficiently far ahead for the state machine 1000 to change states and for the new state to assert which modulator will now receive the delayed DCL signal before the transition occurs.

In embodiments, the DCL systems and techniques described above may have simple transmit-side (transceiver) implementation. For example, in 5G designs across sub-6 GHz frequency bands (so-called "FR1 applications"), the system and techniques above may be implemented using conventional driver circuits (e.g. conventional single-ended complementary metal oxide semiconductor (CMOS) driver circuits).

In 5G designs across RF frequency bands (including, but not limited to millimeter wave (MMW) frequency bands) (so-called "FR2 applications"), the DCL information may be transmitted along one or more RF transmission lines coupling a transceiver to an RF head unit (e.g. a MMW head). In one embodiment, one or more coaxial transmission lines may be used. Other types of RF transmission lines, may of course, also be used, such as coaxial, waveguide, strip transmission lines, etc.

The techniques described are not limited to 5G designs across MMW frequency bands. Rather the techniques described may be used in any radio link and may find particular use in applications in which arrays could benefit from an RF interface such as a single RF interface, for example, a single-coaxial interface. Other applications include, but are not limited to sub-6 massive MIMO, 5G and/or radar applications.

The control circuits may be implemented by custom circuitry or programmable hardware such as an FPGA that is designed or programmed to effectuate the circuits and techniques described above. Additionally, or alternatively, the control circuits may include general purpose processors that execute software instructions to effectuate the systems and techniques described above. In this case, the software instructions executed by the control circuit may be stored on non-volatile hardware storage devices such as a FLASH, ROM, RAM, hard drive, or the like.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to disposing or otherwise positioning element "A" over element "B" include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. As used herein, the terms "comprise," "comprises," "comprising, "include," "includes," "including," "has," "having," "contains" or "containing," or any other variation thereof, are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "embodiments," "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, relative or positional terms including but not limited to the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

Accordingly, it is submitted that that scope of the patent should not be limited to the described implementations but rather should be limited only by the spirit and scope of the following claims.

All publications and references cited herein are expressly incorporated herein by reference in their entirety.

What is claimed is:

1. A method comprising:
generating a plurality of voltage bias signals;
time delaying at least one of the plurality of voltage bias signals to provide at least one time-delayed voltage bias signal which is time delayed relative to at least one other of the plurality of voltage bias signals; and
combining, in a combiner circuit, at least one of the at least one time-delayed voltage bias signal with at least one of the at least one other of the plurality of voltage bias signals to provide a split transition signal at an output of the combiner circuit.

2. The method of claim 1 coupling the split transition signal to a bias terminal of a radio frequency (RF) amplifier.

3. The method of claim 1 wherein:
generating a plurality of voltage bias signals comprises generating a plurality of discrete voltage bias signals;
time delaying at least one of the plurality of voltage bias signals comprises time delaying at least one of the plurality of discrete voltage bias signals; and
combining the at least one of the at least one time-delayed voltage bias signal with at least one of the at least one other of the plurality of voltage bias signals comprises combining at least one time-delayed discrete voltage bias signal with at least one other of the plurality of discrete voltage bias signals.

4. The method of claim 3 wherein combining the at least one discrete time-delayed voltage bias signal with the at least one other of the plurality of discrete voltage bias signals shapes spectral components resultant from transitions among discrete bias voltages.

5. The method of claim 3 further comprising:
detecting an impending transition between first and second discrete voltage bias signal levels; and
selecting which of the plurality of discrete voltage bias signals to provide as time-delayed discrete voltage bias signals.

6. The method of claim 5 wherein detecting an impending transition between first and second discrete voltage bias signal levels comprises detecting whether the impending transition will be to a voltage which is higher than a current discrete voltage or a voltage which is lower than a current discrete voltage.

7. The method of claim 6 wherein in response to detecting whether the impending transition will be to a voltage which is higher than a current voltage or a voltage which is lower voltage than a current voltage, the method comprises applying the at least one time-delayed discrete voltage bias signal to a selected one or more of the discrete voltage bias signals.

8. A split transition circuit comprising:
a plurality of modulators with each of the plurality of modulators configured to accept a selected one of a plurality of discrete voltage levels $V_1$-$V_N$ at respective inputs thereof and in response to selecting one of the plurality of discrete voltage levels $V_1$-$V_N$, each of the plurality of modulators provides a modulated power supply output signal at an output thereof;
at least one delay circuit, each of the at least one delay circuit coupled to a corresponding one of the plurality of modulators to provide a delay to a modulated power supply output signal provided at the output of the corresponding one of the plurality of modulators such that a transition from a first to a second, different voltage level of at least a first one of the modulated power supply output signals is delayed relative to a transition from a first to a second, different voltage level of at least a second one of the modulated power supply output signals provided by the plurality of modulators; and
a combiner circuit having a plurality of inputs, each input coupled to the output of a respective one of the plurality of modulators, wherein in response to signals provided to the inputs thereof, the combiner circuit combines the signals provided thereto and provides at an output thereof, a combined power supply output signal corresponding to one or more split transition signals.

9. The split transition circuit of claim 8 wherein at least one of the at least one delay circuit is a programmable delay circuit.

10. The split transition circuit of claim 8 further comprising means for determining which of the plurality of modulators to provide a delay.

11. The split transition circuit of claim 8 wherein the combiner circuit comprises at least one of:
a. an interphase transformer;
b. a coupled magnetic combiner;
c. uncoupled inductors;
d. a lumped element three-port network;
e. an isolating power combiner;
f. an isolating power combiner with an energy recovery system;
g. a non-isolating combiner;
h. one or more transmission lines; or
i. combinations of transmission lines and/or energy storage elements.

12. The split transition circuit of claim 8, wherein:
the transition of the at least first one of the modulated power supply output signals between first and second voltage levels takes place at a time $t_0 - T_D/2$; and
the transition of the at least second one of the modulated power supply output signals between first and second voltage levels takes place at a time $t_0 + T_D/2$,
where $T_D$ is a time delay between the transition of the at least first one of the modulated power supply output signals and the transition of the at least second one of the modulated power supply output signals.

13. The split transition circuit of claim 12, wherein:
the first voltage level of the at least first one of the modulated power supply output signals is substantially equal to the first voltage level of the at least second one of the modulated power supply output signals; and
the second voltage level of the at least first one of the modulated power supply output signals is substantially equal to the second voltage level of the at least second one of the modulated power supply output signals.

14. The split transition circuit of claim 8, wherein an amplitude of a waveform at the output of the combiner circuit is a combination of amplitudes of modulated power supply output signals from at least two of the plurality of modulators.

15. The split transition circuit of claim 8, wherein an amplitude of a waveform at the output of the combiner circuit corresponds to an average of amplitudes of modulated power supply output signals from at least two of the plurality of modulators.

16. The split transition circuit of claim 8, wherein an amplitude of a waveform at the output of the combiner circuit corresponds to an average computed from an amplitude of the at least first one of the modulated power supply output signals and an amplitude of the at least second one of the modulated power supply output signals.

17. The split transition circuit of claim 8 wherein inputs of the plurality of modulators are configured to be coupled to a single power supply such that a single power supply provides voltages $V_1$-$V_N$ to inputs of each of the plurality of modulators.

18. The split transition circuit of claim 8 wherein inputs of the plurality of modulators are configured to be coupled to outputs of a respective one of a plurality of different power supplies such that each of the plurality of modulators receive voltages $V_1$-$V_N$ from a respective one of a plurality of different power supplies.

19. The split transition circuit of claim 8 further comprising a filter circuit having an input coupled to the output of the combiner circuit, the filter circuit having a filter characteristic selected to filter transitions between voltage levels of the one or more split transition signals.

20. A system comprising:
a split transition circuit comprising:
a plurality of modulators each having an input configured to select from among a discrete set of voltage levels $V_1$-$V_N$, the plurality of modulators operable to concurrently provide for period of time modulated power supply output signals at respective outputs thereof, and
a combiner circuit having a plurality of inputs, each input coupled to a respective one of the plurality of modulated power supply output signals, wherein in response to signals provided to the inputs thereof, the combiner circuit combines the modulated power supply output signals and provides a combined power supply output signal corresponding to one or more split transition signals at an output thereof.

21. The system of claim 20 further comprising at least one radio frequency (RF) amplifier having a bias port coupled to the output of the combiner circuit such that a voltage signal provided to the bias port of the amplifier is modulated using the one or more split transition signals.

22. The system of claim 20 wherein inputs of the plurality of modulators are configured to be coupled to outputs of a respective one of one or more power supplies such that each of the plurality of modulators receive voltages $V_1$-$V_N$ from a respective one of the one or more power supplies.

23. The system of claim 20 wherein a first one of the plurality of modulators provides a first modulated power supply output signal at an output thereof and a second one of the plurality of modulators provides a second modulated power supply output signal at an output thereof.

24. The system of claim 20 wherein a first one of the plurality of modulators provides a first modulated power supply output signal at an output thereof and a second one of the plurality of modulators provides a second, different modulated power supply output signal at an output thereof.

25. The system of claim 21 further comprising a filter circuit coupled between the output of the combiner circuit and the bias port of at least one of the at least one RF amplifier, the filter circuit having a filter characteristic selected to filter the one or more split transition signals to smooth transitions between voltages at the bias port of the at least one of the at least one RF amplifier.

26. In a system having one or more radio frequency (RF) amplifiers each having an RF input, an RF output and a supply terminal and at least one multi-level power supply coupled to respective ones of the supply terminals of the one or more RF amplifiers, each of the at least one multi-level power supply configured to provide a plurality of discrete supply voltages to respective ones of the supply terminals, a split transition circuit comprising:
a control circuit having outputs at which are provided control signals to modulate the plurality of discrete supply voltages provided to the supply terminals of the one or more RF amplifiers; and
one or more delay circuits coupled between at least one of the control circuit outputs and the respective ones of the supply terminals to introduce a time delay to at least one control signal provided by the control circuit with the time delay selected to introduce a null frequency into an operating frequency spectrum of the one or more RF amplifiers.

27. The system of claim 26 further comprising a lookahead delay circuit coupled to at least one of the one or more delay circuits, the lookahead delay circuit configured to set a value of a time delay based upon an impending transition from a first discrete supply voltage to a second, different discrete supply voltage.

28. The system of claim 27 further comprising a transition detect circuit to detect a direction of an impending supply voltage transition.

29. The system of claim 28 further comprising:
a controller coupled to the transition detect circuit; and
one or more switches or multiplexors coupled to the lookahead delay circuit and to the controller, the controller responsive to signals provided thereto from the transition detect circuit to dynamically determine which of the one or more switches or multiplexors receives the at least one delayed control signal and which receives one or more non-delayed control signals.

30. A method comprising:
generating a plurality of control signals;
time delaying at least one control signal of the plurality of control signals to provide the at least one control signal having a relative time delay with respect to at least one other control signal to provide a split transition signal;
providing each of the plurality of control signals to a corresponding one of a plurality of modulators; and
combining signals from outputs of the plurality of modulators.

31. The method of claim 30 further comprising providing a delayed control signal to a first modulator and a non-delayed control signal to a second different modulator.

32. The method of claim 30 wherein generating the plurality of control signals comprises:
- generating a control signal; and
- splitting the control signal into a plurality of signal paths with each signal path coupled to a corresponding one of the plurality of modulators thereby allowing control signals to be transmitted to each of the plurality of modulators.

\* \* \* \* \*